(12) United States Patent
Wang

(10) Patent No.: US 8,412,143 B2
(45) Date of Patent: Apr. 2, 2013

(54) DOUBLED BALANCED MIXER WITH IMPROVED COMPONENT MATCHING

(75) Inventor: Cheng-Han Wang, San Jose, CA (US)

(73) Assignee: QUALCOMM, Incorporated, San Diego, CA (US)

(*) Notice: Subject to any disclaimer, the term of this patent is extended or adjusted under 35 U.S.C. 154(b) by 298 days.

(21) Appl. No.: 12/580,998

(22) Filed: Oct. 16, 2009

(65) Prior Publication Data

US 2011/0092178 A1 Apr. 21, 2011

(51) Int. Cl.
*H04B 1/16* (2006.01)
(52) U.S. Cl. .................................................. 455/323
(58) Field of Classification Search .............. 455/313, 455/319, 323, 326, 333
See application file for complete search history.

(56) References Cited

U.S. PATENT DOCUMENTS

| | | | |
|---|---|---|---|
| 6,184,739 B1* | 2/2001 | Doyle | 327/359 |
| 6,226,509 B1* | 5/2001 | Mole et al. | 455/302 |
| 6,871,057 B2* | 3/2005 | Ugajin et al. | 455/323 |
| 7,113,756 B2 | 9/2006 | Abdelli | |
| 7,271,668 B2 | 9/2007 | Bagheri et al. | |
| 7,554,380 B2 | 6/2009 | Embabi et al. | |
| 7,865,164 B2 | 1/2011 | Xu et al. | |
| 2001/0036818 A1* | 11/2001 | Dobrovolny | 455/326 |
| 2002/0032016 A1* | 3/2002 | Ji | 455/326 |
| 2002/0193089 A1* | 12/2002 | Hatcher et al. | 455/326 |
| 2003/0109238 A1 | 6/2003 | Kim et al. | |
| 2004/0259519 A1* | 12/2004 | Su | 455/326 |
| 2007/0132500 A1 | 6/2007 | Embabi et al. | |
| 2009/0075622 A1 | 3/2009 | Zhuo et al. | |
| 2009/0154595 A1 | 6/2009 | Choksi et al. | |
| 2009/0202022 A1 | 8/2009 | Kaczman et al. | |
| 2009/0203347 A1 | 8/2009 | Kaczman et al. | |
| 2010/0085104 A1 | 4/2010 | Yotsuji | |

FOREIGN PATENT DOCUMENTS

| | | |
|---|---|---|
| JP | 2008091994 A | 4/2008 |
| WO | WO2008054330 A1 | 5/2008 |
| WO | WO2008084760 A1 | 7/2008 |

OTHER PUBLICATIONS

International Search Report and Written Opinion—PCT/US2010/052966, International Search Authority—European Patent Office—Feb. 25, 2011.

(Continued)

*Primary Examiner* — Blane J Jackson
(74) *Attorney, Agent, or Firm* — Ramin Mobarhan

(57) ABSTRACT

An improved passive double balanced mixer with reduced capacitor voltage mismatch is described. A passive double balanced mixer includes two sets of mixer circuits, each comprised of switches. Each switch is separately divided into a first portion and a second portion of unequal number of fingers. A first and second LO AC coupling capacitors associated with a given switch are coupled at one end to an LO signal. The outputs of the first LO AC coupling capacitors are coupled to the first portion of the first switch and the second portion of the second switch, respectively, while the outputs of the second LO AC coupling capacitors are coupled to the second portion of the first switch and the first portion of the second switch, respectively. In one embodiment, the unequal number of fingers is defined by an n−1 and an n+1 number of fingers, respectively. In an alternate embodiment, the mixer is an ADB mixer with a transconductance amplifier and two sets of mixer circuits as above.

23 Claims, 5 Drawing Sheets

OTHER PUBLICATIONS

Bautista E.E., et al., "A High IIP2 Downconversion Mixer Using Dynamic Matching", IEEE Journal of Solid-State Circuits, vol. 35, Issue: 12, pp. 1934-1941, Dec. 2000.

Brandolini M. et al., "A +78 dBm IIP2 CMOS direct downconversion mixer for fully integrated UMTS receivers," IEEE J. Solid-State Circuits, vol. 41, No. 3, pp. 552-559, Mar. 2006.

Manstretta, et al., "Second-Order Intermodulation Mechanisms in CMOS Downconverters," IEEE Journal of Solid-State Circuits, vol. 38, No. 3, Mar. 2003, pp. 394-406.

Nguyen, T.-K. et al.: "A 900 MHz CMOS RF Direct Conversion Receiver Front-end with 3dB NF and 30-KHz 1/f Noise Corner," IEEE Asian Solid-State Circs. Conf., TW, Nov. 2005, pp. 349-352.

Wu, et al., "Layout Effects on Design Optimization of CMOS LNA and Mixer", IEEE MTT-S International Microwave Symposium digest, vol. 4, pp. 2067-2070, 2005.

Zhou S., et al., "A CMOS passive mixer with low flicker noise for low-power direct-conversion receiver", IEEE Journal of Solid-State Circuits, vol. 40, Issue: 5, pp. 1084-1093, May 2005.

Elahi, et al., "IIP2 and DC Offsets in the Presence of Leakage at LO Frequency," IEEE Transactions on Circuits and Systems II: Express Briefs, vol. 53, No. 8, Aug. 2006, pp. 647-651.

Hadjichristos, et al., "Single-chip RF CMOS UMTS/EGSM transceiver with integrated receive diversity and GPS," IEEE International Solid-State Circuits Conference, Digest of Technical Papers, ISSCC 2009, pp. 118-119.

Kivekas, et al., "Characterization of IIP2 and DC-offsets in transconductance mixers," IEEE Transactions on Circuits and Systems II: Analog and Digital Signal Processing, Nov. 2001, vol. 48, Issue 11, pp. 1028-1038.

\* cited by examiner

DOUBLED BALANCED MIXER WITH IMPROVED COMPONENT MATCHING

TECHNICAL FIELD

The present disclosure relates to mixer circuits, and in particular, to double balanced mixer circuits with improved component matching.

BACKGROUND

Mixer circuits are used in a variety of applications. For example, they are often used in radio frequency (RF) applications for up-converting or down-converting. In this context up-converting is the process of mixing a baseband signal such as a differential baseband signal, with an RF signal that is generated by a local oscillator circuit that operates in the RF range. This process generates a mixed RF signal with the baseband information included within the RF signal generated by the local oscillator. Down converting is the process of separating the baseband signal from the mixed RF signal generated by the local oscillator. When the radio frequency (RF) spectrum is directly translated to the baseband in the first down-conversion, the receiver is called a "homodyne," "direct-conversion," or "Zero-IF" architecture.

FIG. 1 shows a conventional double balanced mixer 100. Double balanced mixer (DBM) 100 includes two mixer circuits the outputs of which are coupled to common load. DBM 100 is comprised generally of two sets of differential transistor pairs M1/M2 110/112 and M3/M4 114/116, each of which receives a first differential input signal RF_P, RF_M, respectively. The two sets of differential transistor pairs M1/M2 110/112 and M3/M4 114/116 receive a second differential signal LO_P, LO_M that drives the gates of transistor pairs M1/M3 110/114 and M2/M4 112/116, respectively. This second differential signal typically arrives from a local oscillator (LO). The biasing of the gate, drain and source terminals of transistors M1 110, M2 112, M3 114 and M4 116 is well known in the art and shall not be described.

While M1 110, M2 112, M3 114 and M4 116 are shown as transistor devices, it is known to substitute any equivalent amplifying or switching device in the configuration shown. The term passive is generally used to indicate that a mixer configuration performs no amplification. The term active is generally used to indicate that a mixer configuration performs amplification. Complementary-metal-oxide (CMOS) semiconductor technology is a common fabrication process technology.

It is desirable to match M1 110, M2 112, M3 114 and M4 116. However manufacturing variations may cause components of the circuit to be mismatched. Such mismatches may cause the output of the circuit to include a variety of unwanted frequencies. For example mismatch in the differential devices M1 110 and M2 112 or M3 114 and M4 116 may cause even harmonics. In some cases, harmonic impurities resulting from manufacturing variances may be very small and effectively negligible. When the variances are sufficiently large, harmonic impurities may impact system performance. For example, in a DBM for a direct conversion receiver, second order inter-modulation (IM2) products in particular may especially degrade the signal-to-noise ratio (SNR) at the baseband. Large manufacturing variations may even cause the system to be completely inoperable. Thus, some portions of the circuits produced by the manufacturing process may have to be discarded, thereby affecting the "yield" of the process. As manufacturing is moving to smaller process nodes, controlling the manufacturing process variances is increasingly difficult, thus methods to improve the spectral purity of mixer circuits have been presented.

FIG. 2 shows the double balanced mixer of FIG. 1 with IM2 product mismatch correction.

To address the effects of mismatch, one or more bias voltages of transistors M1 210, M2 212, M3 214 and M4 216 may be adjusted. In the specific example of FIG. 2, the gate terminals of transistors M2 212 and M4 216 are connected to a gate voltage Vg through resistors $R_2$ 214 and $R_4$ 218, respectively. Vg may not be configurable, as when tied to an on-chip voltage reference.

A digital-to-analog converter (DAC) 222 configures the gates of transistors $M_1$ 210 and $M_3$ 214 through resistors $R_1$ 212 and $R_3$ 216, respectively. Resistors $R_1$ 212, $R_2$ 214, $R_3$ 216 and $R_4$ 218 nominally have the same value. More specifically, when the differential signals IF_P and IF_M are not matched, DAC 222 introduces an appropriate DC voltage at the gate of the two devices $M_1$ 210 and $M_3$ 214, to cause the signals IF_P and IF_M to closely match. Capacitors $C_{1P}$ 202, $C_{1M}$ 206, $C_{2P}$ 204 and $C_{2M}$ 208 serve to couple only the AC components of the signals LO_P and LO_M to the mixer, while isolating the DC voltage of the local oscillator circuit from the bias voltage at the gate of devices $M_1$ 210, $M_2$ 212, $M_3$ 214 and $M_4$ 216, respectively. Capacitors $C_{1P}$ 202, $C_{1M}$ 206, $C_{2P}$ 204 and $C_{2M}$ 208 nominally have the same capacitance value.

In the configuration shown in FIG. 2, device mismatches are corrected without regard to spectral purity at the output caused by possible mismatch between AC coupling capacitors $C_{1P}$ 202, $C_{1M}$ 206, $C_{2P}$ 204 and $C_{2M}$ 208. Mismatch between AC coupling capacitors $C_{1P}$ 202, $C_{1M}$ 206, $C_{2P}$ 204 and $C_{2M}$ 208 is not generally a main source of IM2 products when large capacitors are used to couple the local oscillator signal to the mixer.

However, as devices get smaller and smaller, driven particularly by the demand for smaller and smaller multi-mode, multi-protocol radio transceiver architectures, a need arises for reducing the die area and power consumed by mixers incorporated therein.

As technologies scale down, active devices (such as diodes and transistors) incorporated therein also scale down in size. Passive devices (i.e., resistors, capacitors and inductors) by comparison do not scale down proportionately. The end result is that passive components become a significant stumbling block to miniaturization and power efficiency. This is particularly the case with AC coupling capacitors used in mixers.

The optimum size of an AC-coupling capacitor size is directly related to a desired frequency of operation of the mixer. As the desired frequency of operation increases, the value and hence the size of the AC coupling capacitor value may also be reduced.

Any reduction, however, in local oscillator AC-coupling capacitance motivated by a desire to reduce capacitor size results in greater mismatch. This mismatch will cause a coupling signal strength difference between the LO_P and LO_M signals. This in turn can impact IM2 performance of the mixer requiring calibration and correction, which may not be possible without additional circuitry contributing to additional area, circuit complexity and power inefficiency.

Minimizing this additional source of impact without any additional calibration circuitry is beneficial in double balanced mixers where one or more local oscillator (LO) capacitors for a same polarity are split for IM2 calibration purposes.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The present disclosure is directed to double balanced mixers where one or more local oscillator (LO) capacitors for a same polarity are split for IM2 calibration purposes.

Figure 1:
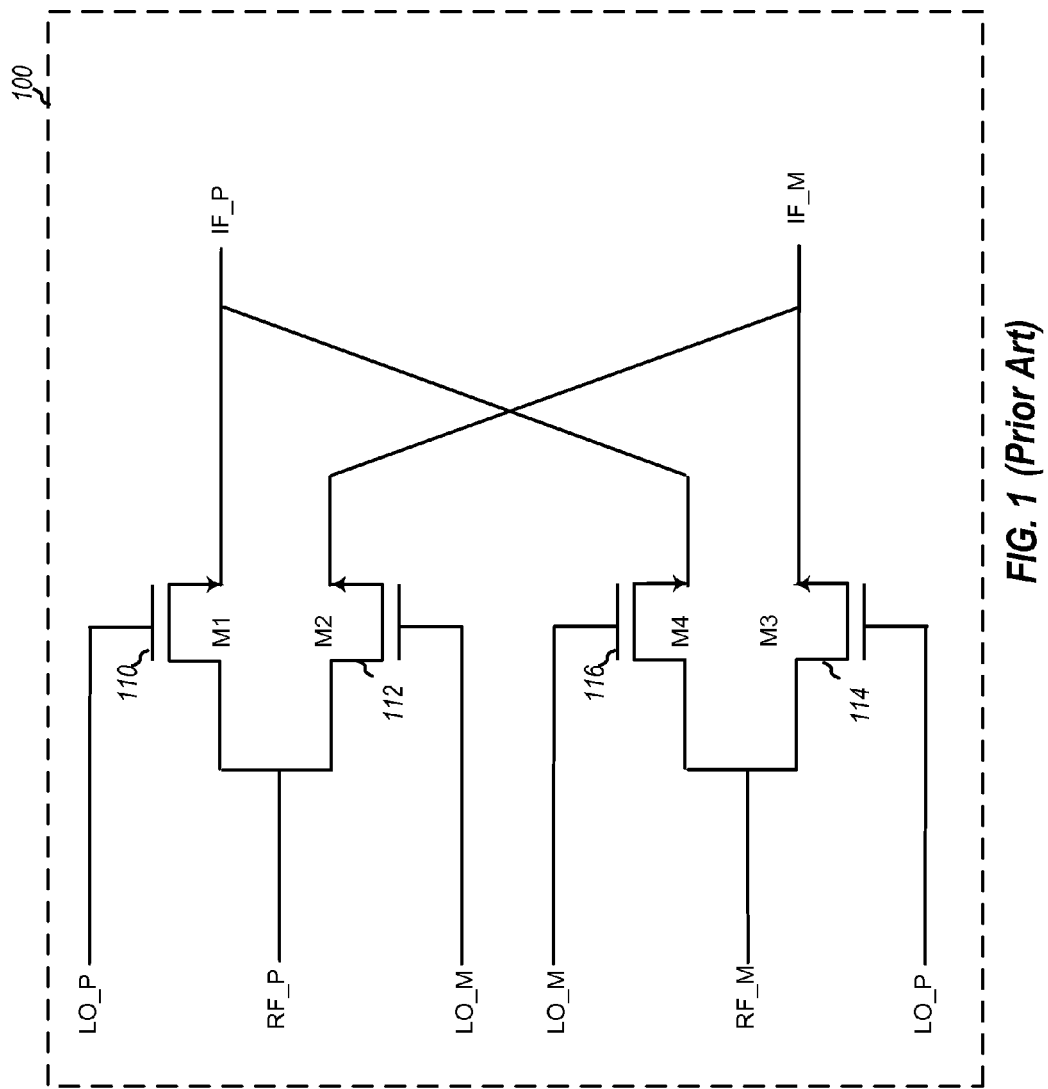
FIG. 1 shows a double balanced mixer.
Figure 2:
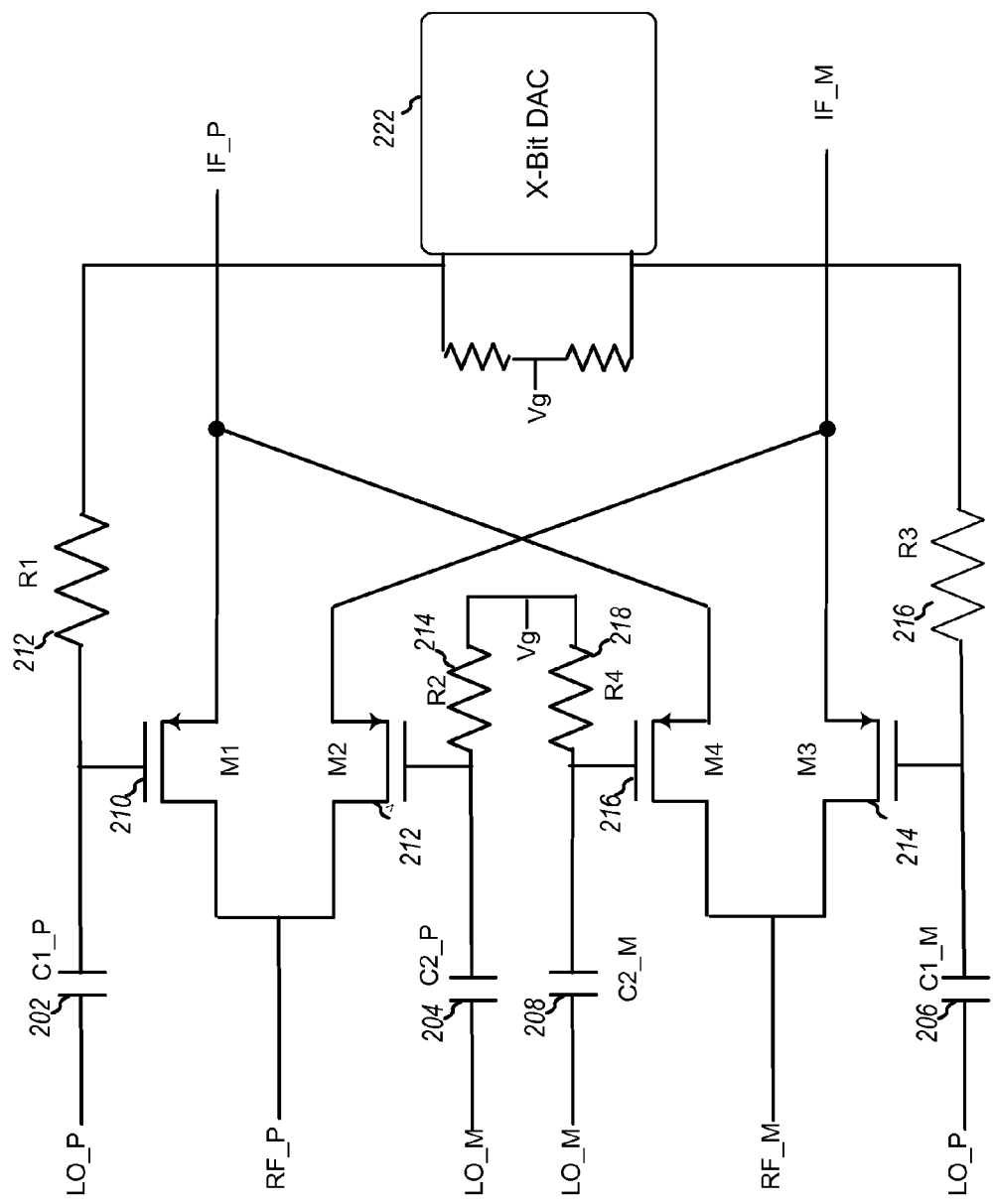
FIG. 2 shows a double balanced mixer of FIG. 1 with IM2 product mismatch correction.
Figure 3:
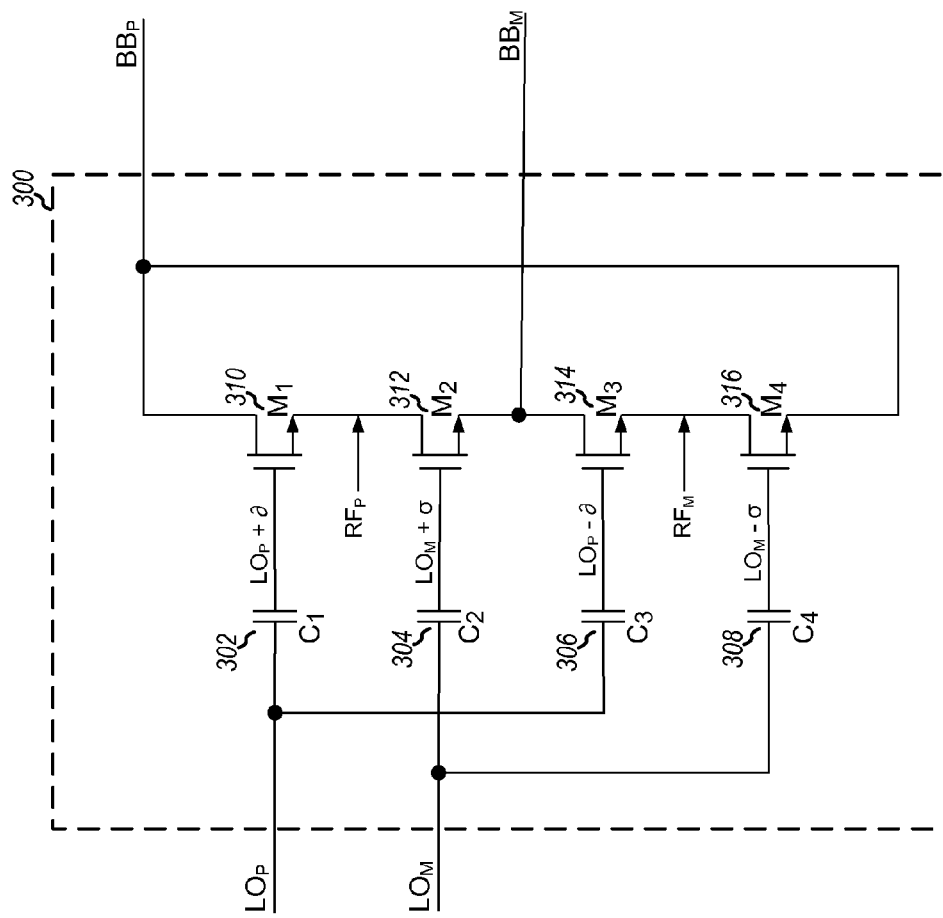
FIG. 3 shows a double balanced mixer with mismatched LO coupling capacitors.

FIG. 3 shows a passive double balanced mixer 300 with mismatched LO coupling capacitors 302, 304, 306, 308. As shown, a positive local oscillator signal ($LO_P$) is coupled to a first terminal of capacitors 302 and 306. A second terminal of capacitor 302 is coupled to a gate terminal of transistor 310. A drain terminal of transistor 310 is coupled to the positive baseband output terminal ($BB_P$). A second terminal of capacitor 306 is coupled to a gate terminal of transistor 314. A drain terminal of transistor 314 is coupled to the negative baseband output terminal ($BB_M$).

A negative local oscillator signal ($LO_M$) is coupled to a first terminal of capacitors 304 and 308. A second terminal of capacitor 304 is coupled to a gate terminal of transistor 312. A source terminal of transistor 312 is coupled to the negative baseband output terminal ($BB_M$). A second terminal of capacitor 308 is coupled to a gate terminal of transistor 316. The source terminal of transistor 316 is coupled to the positive baseband output terminal ($BB_P$). A source terminal of transistor 310 is coupled to a drain terminal of transistor 312 and positive RF input signal ($RF_P$). A source terminal of transistor 314 is coupled to a drain terminal of transistor 316 and negative RF input signal ($RF_M$).

The signal present at the gate terminal of transistor 310 may be expressed as:

$$LO_P + \delta \qquad \text{Eq. 1}$$

where $\delta$ is the amplitude or phase variation to the positive local oscillator signal as a result of passing through capacitor 302.

Similarly, the signal present at the gate terminal of transistor 312 may be expressed as:

$$LO_M + \sigma \qquad \text{Eq. 2}$$

where $\sigma$ is the amplitude or phase variation to the negative local oscillator signal as a result of passing through capacitor 304.

The signal present at the gate terminal of transistor 314 may be expressed as:

$$LO_P - \delta \qquad \text{Eq. 3}$$

where $\delta$ is the amplitude or phase variation to the positive local oscillator signal as a result of passing through capacitor 306.

The signal present at the gate terminal of transistor 316 may be expressed as:

$$LO_M - \sigma \qquad \text{Eq. 4}$$

where $\sigma$ is the amplitude or phase variation to the negative local oscillator signal as a result of passing through capacitor 308.

The resulting signal present at the positive baseband output terminal may be expressed as:

$$BB_P = (LO_P + \delta)RF_P + (LO_M - \sigma)RF_M \qquad \text{Eq. 5}$$

The resulting signal present at the negative baseband output terminal may be expressed as:

$$BB_M = (LO_P - \delta)RF_M + (LO_M + \sigma)RF_P \qquad \text{Eq. 6}$$

From equations 5 and 6, the resulting signal present across the baseband output terminals may be expressed as:

$$BB_{OUT} = BB_P - BB_M = (LO_P - \delta)RF_M + (LO_M + \sigma)RF_P \qquad \text{Eq. 7}$$

As can be seen, capacitor voltage mismatch significantly contributes to the overall baseband voltage level at the output of mixer 300.

An improved passive double balance mixer with reduced capacitor voltage mismatch is described below. A passive double balance mixer includes two sets of mixer circuits, each comprised of switches. Each switch is separately divided into a first portion and a second portion of unequal number of fingers. A first and second LO AC coupling capacitors associated with a given switch are coupled at one end to a first LO signal. The outputs of the first and second LO AC coupling capacitors are coupled to the first and second portions of the two switches, respectively. In one embodiment, the unequal number of fingers is defined by an n+1 and an n−1 number of fingers, respectively.

Figure 4:
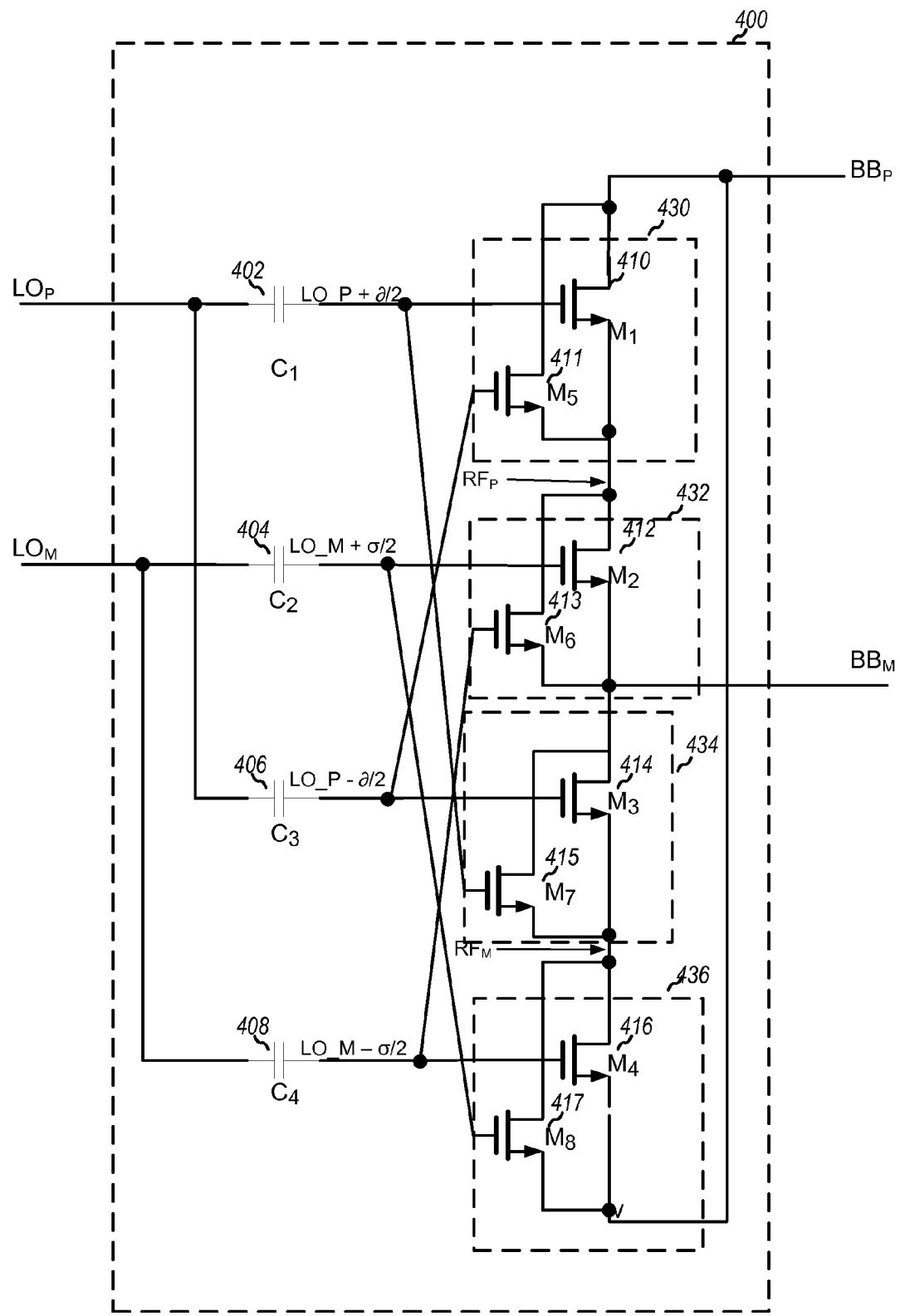
FIG. 4 shows a passive double balanced mixer in accordance with an exemplary embodiment.

FIG. 4 shows a passive double balanced mixer 400 in accordance with an exemplary embodiment. Here, each switch 430, 432, 434, 436 has 2N fingers divided into two portions of unequal number of fingers, N−x and N+x, each constituting a separate and distinct transistor. In an exemplary embodiment, the first portion comprises N−1 fingers and the second portion comprises N+1 fingers. A positive local oscillator signal ($LO_P$) is coupled to a first terminal of capacitors 402 and 406. A second terminal of capacitor 402 is coupled to a gate terminal of transistors 410 (having N−1 fingers) and 415 (having N+1 fingers). A drain terminal of transistor 410 is coupled to the positive baseband output terminal (BB$_P$). A drain terminal of transistor 415 is coupled to the negative baseband output terminal (BB$_M$). A second terminal of capacitor 406 is coupled to a gate terminal of transistors 414 (having N−1 fingers) and 411 (having N+1 fingers). A drain terminal of transistor 414 is coupled to the negative baseband output terminal (BB$_M$). A drain terminal of transistor 411 is coupled to the positive baseband output terminal (BB$_P$).

A negative local oscillator signal (LO$_M$) is coupled to a first terminal of capacitors 404 and 408. A second terminal of capacitor 404 is coupled to a gate terminal of transistors 412 (having N−1 fingers) and 417 (having N+1 fingers). A source terminal of transistor 412 is coupled to the negative baseband output terminal (BB$_M$). A source terminal of transistor 417 is coupled to the positive baseband output terminal (BB$_P$). A second terminal of capacitor 408 is coupled to a gate terminal of transistors 416 (having N−1 fingers) and 413 (having N+1 fingers). A source terminal of transistor 416 is coupled to the positive baseband output terminal (BB$_P$). A source terminal of transistor 413 is coupled to the negative baseband output terminal (BB$_M$).

A source terminal of transistor 410 is coupled to a drain terminal of transistor 412, a drain terminal of transistor 413, a source terminal of transistor 411 and a positive RF input signal (RF$_P$). A source terminal of transistor 414 is coupled to a drain terminal of transistor 416, a drain terminal of transistor 417, a source terminal of transistor 415 and a negative RF input signal (RF$_M$).

For simplicity reasons the number of fingers in FIG. 4 is considered normalized (instead of N−1, we have (N−1)/2N and instead of N+1, we have (N+1)/2N)

In the configuration of passive double balance mixer 400, the signal present at the gate terminal of transistors 410 and 415 may be expressed as:

$$LO_P + \frac{\delta}{2} \qquad \text{Eq. 8}$$

where δ is the amplitude or phase variation to the positive local oscillator signal as a result of passing through capacitor 402.

The signal present at the gate terminal of transistors 412 and 417 may be expressed as:

$$LO_M + \frac{\sigma}{2} \qquad \text{Eq. 9}$$

where σ is the amplitude or phase variation to the negative local oscillator signal as a result of passing through capacitor 404.

The signal present at the gate terminal of transistors 414 and 411 may be expressed as:

$$LO_P - \frac{\delta}{2} \qquad \text{Eq. 10}$$

where δ is the amplitude or phase variation to the positive local oscillator signal as a result of passing through capacitor 406.

The signal present at the gate terminal of transistors 416 and 413 may be expressed as:

$$LO_M - \frac{\sigma}{2} \qquad \text{Eq. 11}$$

where σ is the amplitude or phase variation to the negative local oscillator signal as a result of passing through capacitor 408.

The resulting signal present at the positive baseband output terminal may be expressed as:

$$BB_P = \left(LO_P + \frac{\delta}{2}\right)RF_P\frac{(N-1)}{2N} + \left(LO_P - \frac{\delta}{2}\right)RF_P\frac{(N+1)}{2N} + \\ \left(LO_M - \frac{\sigma}{2}\right)RF_M\frac{(N-1)}{2N} + \left(LO_M + \frac{\sigma}{2}\right)RF_M\frac{(N+1)}{2N} \qquad \text{Eq. 12}$$

The resulting signal present at the negative baseband output terminal may be expressed as:

$$BB_M = \left(LO_M + \frac{\sigma}{2}\right)RF_P\frac{(N-1)}{2N} + \left(LO_M + \frac{\sigma}{2}\right)RF_P\frac{(N+1)}{2N} + \\ \left(LO_P - \frac{\delta}{2}\right)RF_M\frac{(N-1)}{2N} + \left(LO_P + \frac{\delta}{2}\right)RF_M\frac{(N+1)}{2N} \qquad \text{Eq. 13}$$

Therefore, the resulting signal present across the baseband output terminals may be expressed as:

$$BB_{OUT} = BB_P - BB_M \qquad \text{Eq. 14}\\ = RF_P\left(LO_P - LO_M + \frac{\delta}{N} - \frac{\sigma}{N}\right) + \\ RF_M\left(LO_M - LO_P - \frac{\sigma}{N} + \frac{\delta}{N}\right)$$

As can be seen in the resulting baseband output signal described in equation 14 above, the LO mismatch resulting from the AC coupling capacitors is reduced by a factor of 1/N when switch splitting is implemented within the passive mixer circuit.

Those of skill would further appreciate that a passive double mixer can be configured as an active mixer comprising a transconductance amplifier. It should also be appreciated that active mixer configurations may also generally benefit from dividing switches into separate portions.

Figure 5:
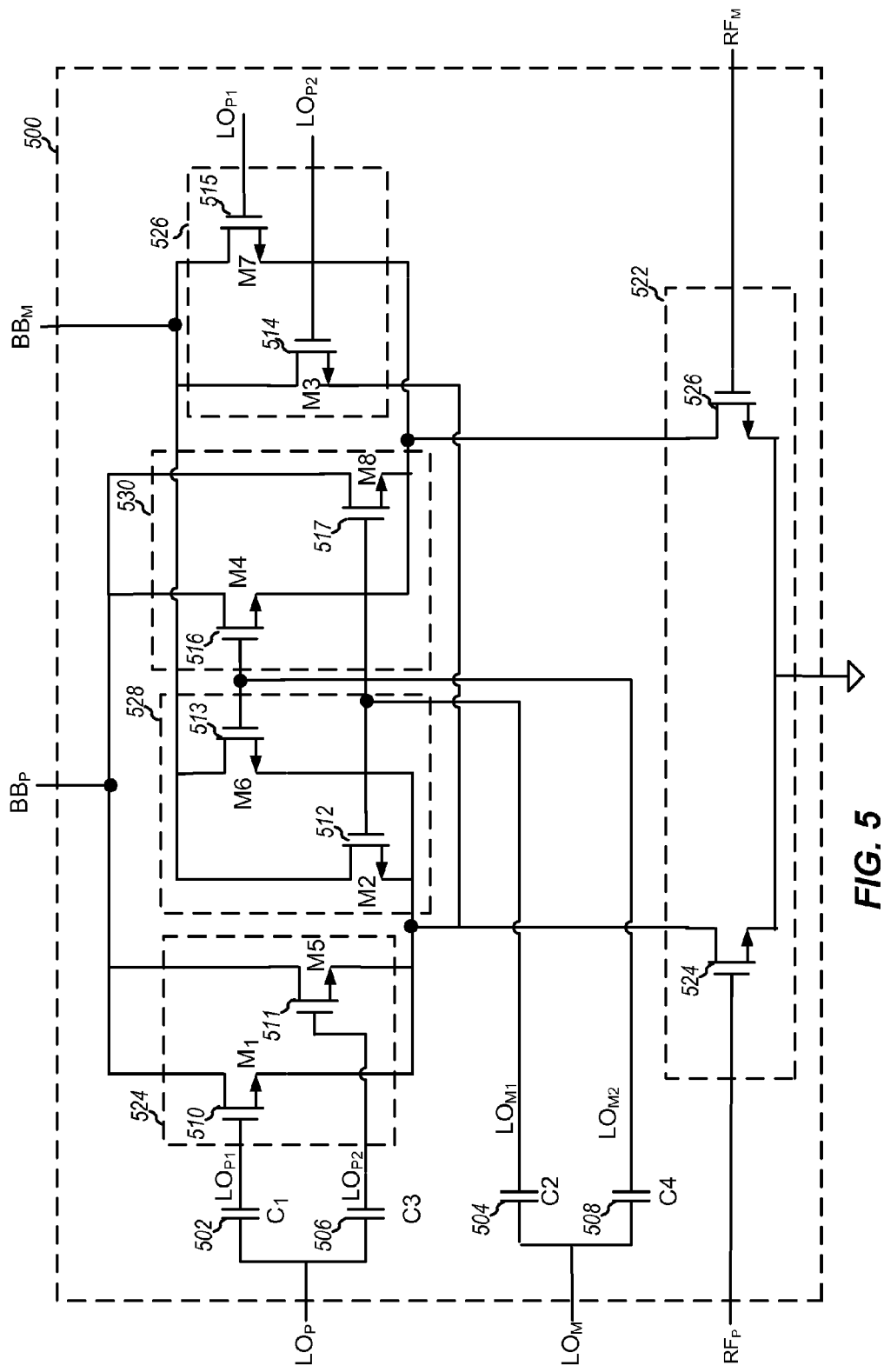
FIG. 5 shows an active double balanced mixer in accordance with an alternate exemplary embodiment.

FIG. 5 shows an active double balanced (ADB) mixer 500 in accordance with an alternate exemplary embodiment. Here, an RF signal is coupled to ADB mixer 500 through transconductance amplifier 522 which provides the desired amplification to the mixer. Here, as in the embodiment of FIG. 4, each switch 530, 532, 534, 536 has 2N fingers divided into two portions of unequal number of fingers, N−x and N+x, each constituting a separate and distinct transistor. In an exemplary embodiment, the first portion comprises N−1 fingers and the second portion comprises N+1 fingers. In the exemplary embodiment of FIG. 5, a positive local oscillator signal (LO$_P$) is coupled to a first terminal of capacitors 502 and 506. A second terminal of capacitor 502 is coupled to a gate terminal of transistors 510 (having N−1 fingers) and 515 (having N+1 fingers). A drain terminal of transistor 510 is coupled to the positive baseband output terminal (BB$_P$). A drain terminal of transistor 515 is coupled to the negative baseband output terminal ($BB_M$). A second terminal of capacitor 506 is coupled to a gate terminal of transistors 514 (having N−1 fingers) and 511 (having N+1 fingers). A drain terminal of transistor 514 is coupled to the negative baseband output terminal ($BB_M$). A drain terminal of transistor 511 is coupled to the positive baseband output terminal ($BB_P$).

A negative local oscillator signal ($LO_M$) is coupled to a first terminal of capacitors 504 and 508. A second terminal of capacitor 504 is coupled to a gate terminal of transistors 512 (having N−1 fingers) and 517 (having N+1 fingers). A drain terminal of transistor 512 is coupled to the negative baseband output terminal ($BB_M$). A drain terminal of transistor 517 is coupled to the positive baseband output terminal ($BB_P$). A second terminal of capacitor 508 is coupled to a gate terminal of transistors 516 (having N−1 fingers) and 513 (having N+1 fingers). A drain terminal of transistor 516 is coupled to the positive baseband output terminal ($BB_P$). A drain terminal of transistor 513 is coupled to the negative baseband output terminal ($BB_M$).

A source terminal of transistor 510 is coupled to a source terminal of transistor 512, a source terminal of transistor 513, a source terminal of transistor 511 and to a transconductance amplifier 522. A source terminal of transistor 514 is coupled to a source terminal of transistor 516, a source terminal of transistor 517, a source terminal of transistor 515 and to a transconductance amplifier 522.

While an ADB mixer has been shown with a specific configuration of a transconductance amplifier, this is only for illustrative purposes, as those skilled in the art of mixer design will readily appreciate that such transconductance amplifier maybe implemented in various embodiments.

In addition, it should be appreciated that while the above exemplary embodiments have been described with switched split into two portions, it may be possible or necessary to split a switch into more than two portions; or if two switches, to split one but not the other.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A double balanced mixer comprising:
   two switches, each switch divided into a first portion comprising a first transistor and a second portion comprising a second transistor, the first and second transistors having an unequal number of fingers; and first and second local oscillator (LO) AC coupling capacitors each having an input coupled to a first LO signal, with outputs of the first and second LO AC coupling capacitors being coupled to the first portion and second portion of the two switches, respectively.

2. The double balanced mixer of claim 1, wherein for each of the two switches, one of the first and second transistors has n−1 fingers, and the other one of the first and second transistors has n+1 fingers.

3. The double balanced mixer of claim 2, wherein the double balanced mixer is a passive double balanced mixer.

4. The double balanced mixer of claim 1, wherein the two switches define a first set of switches, the double balanced mixer further comprising a second set of two switches, where each switch of the second set of two switches is divided into a first portion comprising a third transistor and a second portion comprising a fourth transistor, the third and fourth transistors in each switch having an unequal number of fingers, respectively.

5. The double balanced mixer of claim 4, wherein the double balanced mixer is a passive double balanced mixer.

6. The double balanced mixer of claim 4, further comprising third and fourth LO AC coupling capacitors, each having an input coupled to a second LO signal of opposite polarity relative to the first LO signal, with outputs of the third and fourth LO AC coupling capacitors being coupled to the first and second portions of each switch of the second set of switches, respectively.

7. The double balanced mixer of claim 6, wherein the first and second set of switches are in a bridge configuration.

8. The double balanced mixer of claim 7, wherein the double balanced mixer is a passive double balanced mixer.

9. The double balanced mixer of claim 6, wherein the first, second, third and fourth transistors are each MOS transistors.

10. The double balanced mixer of claim 9, wherein the double balanced mixer is a passive double balanced mixer.

11. The double balanced mixer of claim 6, wherein the double balanced mixer is a passive double balanced mixer.

12. The double balanced mixer of claim 1, wherein the double balanced mixer is adapted for coupling to a digital to analog converter (DAC) to calibrate for IM2 mismatch in the double balanced mixer.

13. The double balanced mixer of claim 12, wherein the double balanced mixer is a passive double balanced mixer.

14. The double balanced mixer of claim 1, wherein the double balanced mixer is a passive double balanced mixer.

15. The double balanced mixer of claim 1, wherein the double balanced mixer is an active double balanced mixer.

16. A wireless communication device including a double balanced mixer comprising:
two switches, each switch divided into a first portion comprising a first transistor and a second portion comprising a second transistor, the first and second transistors having an unequal number of fingers; and
first and second local oscillator (LO) AC coupling capacitors each having an input coupled to a first LO signal, with outputs of the first and second LO AC coupling capacitors being coupled to the first and second portions of the two switches, respectively.

17. The wireless communication device of claim 16, wherein for each of the two switches, one of the first and second transistors has n−1 fingers, and the other one of the first and second transistors has n+1 fingers.

18. The wireless communication device of claim 16, wherein the two switches define a first set of switches, the double balanced mixer further comprising a second set of two switches, where each switch of the second set of two switches is divided into a first portion comprising a third transistor and a second portion comprising a fourth transistor, the third and fourth transistors in each switch having an unequal number of fingers, respectively.

19. The wireless communication device of claim 18, further comprising third and fourth LO AC coupling capacitors, each having an input coupled to a second LO signal of opposite polarity relative to the first LO signal, outputs of the third and fourth LO AC coupling capacitors being coupled to the first and second portions of each switch of the second set of switches, respectively.

20. The wireless communication device of claim 16, wherein the double balanced mixer is a passive double balanced mixer.

21. The wireless communication device of claim 16, wherein the double balanced mixer is an active double balanced mixer.

22. An integrated circuit having a double balanced mixer comprising:
two switches, each switch divided into a first portion comprising a first transistor and a second portion comprising a second transistor, the first and second transistors having an unequal number of fingers; and
first and second local oscillator (LO) AC coupling capacitors each having an input coupled to a first LO signal, with outputs of the first and second LO AC coupling capacitors being coupled to the first portion and second portion of the two switches, respectively.

23. A device including a double balanced mixer comprising:
a plurality of switches, each switch including a number of portions comprising a transistor defined from parallel transistor fingers, the number of fingers in at least a first portion of each switch being of unequal number relative to the number of fingers of at least a second portion in that same switch; and
a plurality of LO AC coupling capacitors each coupled at one end to an LO signal and at the other end to a corresponding portion of each of the plurality of switches to reduce LO capacitance mismatch.

* * * * *